US009530337B2

(12) United States Patent
Hu et al.

(10) Patent No.: US 9,530,337 B2

(45) Date of Patent: Dec. 27, 2016

(54) TEST METHOD AND TEST APPARATUS FOR TRANSPARENT DISPLAY DEVICE

(71) Applicant: BOE TECHNOLOGY GROUP CO., LTD., Beijing (CN)

(72) Inventors: Wang Hu, Beijing (CN); Zhigang Zhang, Beijing (CN); Chunfang Zhang, Beijing (CN); Xinli Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 14/063,695

(22) Filed: Oct. 25, 2013

(65) Prior Publication Data

US 2014/0117993 A1 May 1, 2014

(30) Foreign Application Priority Data

Oct. 26, 2012 (CN) .......................... 2012 1 0418772

(51) Int. Cl.

*G01R 31/00* (2006.01)
*G09G 5/10* (2006.01)
*G09G 3/00* (2006.01)

(52) U.S. Cl.

CPC ...... *G09G 3/006* (2013.01); *G09G 2320/0276* (2013.01); *G09G 2320/0626* (2013.01)

(58) Field of Classification Search

CPC .. G02F 1/133606; G02F 1/1309; G09G 3/006; G09G 2320/0276; G09G 2320/0626
USPC .......................... 324/304, 414, 403; 345/690
See application file for complete search history.

(56) References Cited

U.S. PATENT DOCUMENTS

| | | | | |
|---|---|---|---|---|
| 8,442,316 | B2 * | 5/2013 | Bassi | G06T 5/008 345/55 |
| 2004/0008208 | A1 * | 1/2004 | Dresevic et al. | 345/589 |
| 2005/0222690 | A1 * | 10/2005 | Wang et al. | 700/17 |
| 2008/0232637 | A1 | 9/2008 | Laurent | |
| 2010/0079365 | A1 * | 4/2010 | Feng et al. | 345/102 |
| 2010/0097069 | A1 * | 4/2010 | Sakaguchi et al. | 324/403 |
| 2012/0013819 | A1 * | 1/2012 | Son et al. | 349/61 |
| 2013/0242290 | A1 * | 9/2013 | Yin et al. | 356/218 |

FOREIGN PATENT DOCUMENTS

| | | | |
|---|---|---|---|
| CN | 1065222 | A | 5/2007 |
| CN | 102332242 | A | 1/2012 |
| CN | 102540521 | A | 7/2012 |
| CN | 202916071 | A | 5/2013 |

OTHER PUBLICATIONS

First Chinese Office Action dated Aug. 8, 2014; Appln. No. 201210418772.8.
Second Chinese Office Action dated Feb. 13, 2015; Appln. No. 201210418772.8.

* cited by examiner

*Primary Examiner* — Amy He
(74) *Attorney, Agent, or Firm* — Ladas & Parry LLP

(57) ABSTRACT

Embodiments of the invention provide a test method and a test apparatus for a transparent display device. The test apparatus for the transparent display device comprises: an optical measuring device disposed on one side of the transparent display device to be tested, and a reference object disposed on the other side of the transparent display device to be tested. A brightness of the transparent display device to be tested is adjustable, and the optical measuring device measures a display effect of the reference object through the transparent display device to be tested which is set to different brightness.

18 Claims, 3 Drawing Sheets

TEST METHOD AND TEST APPARATUS FOR TRANSPARENT DISPLAY DEVICE

TECHNICAL FIELD

Embodiments of the invention relate to a test method and a test apparatus for a transparent display device.

BACKGROUND

Along with the advancement in display technology, new display technologies have been constantly proposed and achieved, and transparent display products are just such a new type of display technologies. During the operation process of a transparent display device, a user can clearly see a scene behind the transparent display device through the transparent display device. Due to its transparent appearance, the transparent display device is favored by more and more people, and has become a trend in the development of display technology.

At present, the transparent display devices may be roughly divided into two types in accordance with means for carrying out the technologies: Organic Light-Emitting Diode (OLED) display, and Liquid Crystal Display (LCD). OLED transparent display devices have been gradually put into commercial production due to the advantages of high brightness, high efficiency and high transmittance and the like. In addition, a conventional LCD display can also achieve the transparent display through changing the design of the pixels and the structures of the polarization sheet and backlight source.

As the transparent display device becomes more and more popular, how to reliably and accurately evaluate the performance of the transparent display device has become a problem urgently to be solved. However, as the transparent display device has a structure different from that of the conventional display device, there is still not a standard and uniform test method, so that products produced by different manufacturers are characterized by different performance parameters. Since there is still not the standard and uniform test method, the performances of the products are unable to be evaluated objectively and accurately, it is difficult to perform an optimized design on the whole of the transparent display device, and thus development of the transparent display technology is greatly hindered.

SUMMARY

According to one aspect of the embodiments of the invention, there is provided a test apparatus for a transparent display device. The test apparatus for the transparent display device comprises: an optical measuring device disposed on one side of the transparent display device to be tested, and a reference object disposed on the other side of the transparent display device to be tested. A brightness of the transparent display device to be tested is adjustable, and the optical measuring device measures a display effect of the reference object through the transparent display device to be tested which is set to different brightness.

According to another aspect of the embodiments of the invention, there is provided a test method for a transparent display device. The method comprises:

measuring, by an optical measuring device, a display effect of a reference object through the transparent display device to be tested;

adjusting a brightness of the transparent display device to be tested, and measuring, by the optical measuring device, the display effect of the reference object through the transparent display device to be tested whose brightness has been adjusted;

determining a brightness range of the transparent display device to be tested according to a preset display effect range.

BRIEF DESCRIPTION OF THE DRAWINGS

In order to clearly illustrate the technical solution of the embodiments of the invention, a brief introduction of the drawings of the embodiments shall be given hereinafter, apparently, the drawings described as follows only relate to some embodiments of the invention, but do not limit the invention; for those ordinarily skilled in the art, other drawings can further be obtained based on these drawings without inventive effort.

DETAILED DESCRIPTION

In order to make the object, technical solution and advantages of the embodiments of the invention clearer, the technical solution in the embodiments of the invention shall be clearly and completely described hereinafter in conjunction with the accompanying drawings. Obviously, the described embodiments are part of rather than all of the embodiments of the invention. Based on the embodiments of the invention, all the other embodiments that a person ordinarily skilled in the art obtains without inventive effort are within the scope of the invention.

Figure 1:
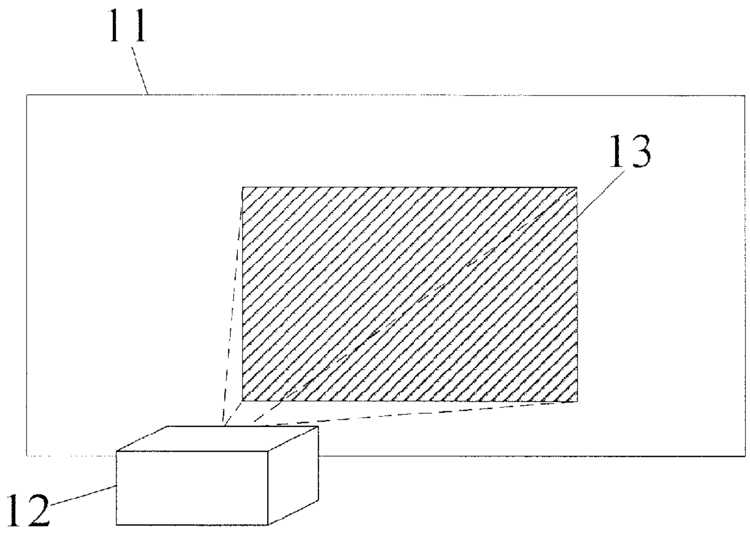
FIG. 1 is a structural schematic diagram illustrating a test apparatus for a transparent display device according to an embodiment of the invention.

As shown in FIG. 1, a test apparatus for a transparent display device according to an embodiment of the invention comprises: an optical measuring device 12 disposed on one side of the transparent display device 11 to be tested, and a reference object 13 disposed on the other side of the transparent display device 11 to be tested.

The reference object 13 for testing the transparent display device 11 may be, for example, a real object or a real scene. Further, for example, cards with different colors or grayscales may be used as the reference object. Besides, a display screen may be used as the reference object, for example, a Liquid Crystal Display (LCD) or an Organic Light-Emitting Diode (OLED) display may be adopted as the reference object.

In the embodiment of the invention, examples are explained all by taking the OLED display as the reference object 13. The use of the OLED display as the reference object 13 enables the color and grayscale of the reference object 13 to change rapidly according to a user's practical requirements. Moreover, the use of the OLED display as the reference object 13 can reduce the overall power consumption of the test apparatus for the transparent display device.

The brightness of the transparent display device 11 to be tested is adjustable. The optical measuring device 12 measures a display effect of the reference object 13 through the transparent display device 11 to be tested which is set to different brightnesses. That is, the display effect of the reference object 13 is measured by the optical measuring device 12 in the condition that the transparent display device 11 to be tested which is set to different brightnesses is provided between the optical measuring device 12 and the reference object 13.

In the test apparatus for the transparent display device according to the embodiment of the invention, the optical measuring device and the reference object are respectively provided on two sides of the transparent display device to be tested. The optical measuring device measures the display effect of the reference object through the transparent display device to be tested. By adjusting the brightness of the transparent display device to be tested, the brightness of the transparent display device to be tested, which brings about a good display effect can be effectively determined, and accordingly an optimum brightness range of the transparent display device to be tested can be obtained. In this way, a scientific and objective evaluation on the transparent display effect of the transparent display device can be achieved. Based on this evaluation result, it is able to adjust or improve the design of the transparent display device, so that a more satisfactory practical viewing effect can be obtained.

Figure 2:
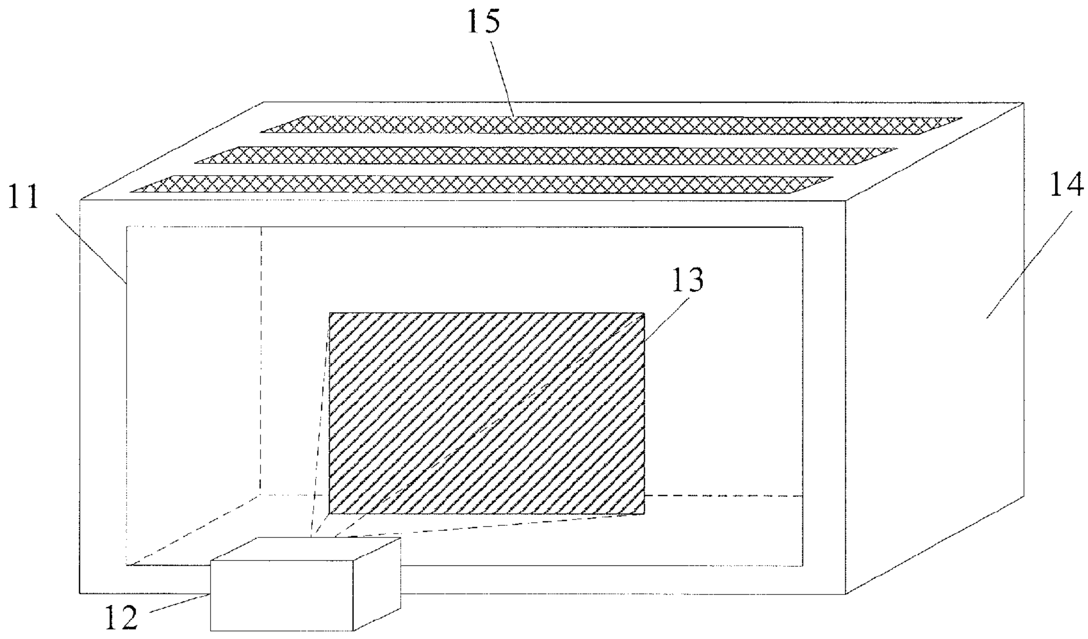
FIG. 2 is a structural schematic diagram illustrating another test apparatus for a transparent display device according to an embodiment of the invention.

Further, as shown in FIG. 2, the test apparatus for the transparent display device may further include a test box 14.

For example, one surface of the test box 14 is provided with the transparent display device 11 to be tested, the reference object 13 is disposed inside the test box 14, and the optical measuring device 12 is disposed outside the test box 14.

In practical applications, such a window-type test apparatus can effectively prevent disadvantageous influences of the external factors, and a variety of different application situations can be simulated by changing the shape of the window-type test apparatus or the internal space of the window-type test apparatus. For example, the test box 14 may be a cube box, a cuboid box, a round case or an oval case. In the test apparatus for the transparent display device as shown in FIG. 2, examples are explained by taking the cuboid box as the test box 14.

Further, in order to better simulate the display effect of the transparent display device under different illumination conditions, the test apparatus for the transparent display device according to the embodiment of the invention may further include a light source. In the test apparatus for the transparent display device shown in FIG. 2, at least one surface of the test box 14 may be provided with the light source 15, and light emitting from the light source 15 irradiates to the inside of the test box 14.

For example, the light source 15 may comprise a Light-Emitting Diode (LED), a Cold Cathode Fluorescent Lamp (CCFL), or an ambient light source.

It should be noted that, in the test apparatus for the transparent display device according to the embodiment of the invention, examples are explained by taking the light source formed of LED and located on the upper surface of the test box 14 as the light source 15.

Further, the optical measuring device 12 may be any measurement device for measuring parameters such as brightness, chrominance, contrast or transparency, or any combination of a plurality of the above-mentioned measurement devices. For example, the optical measuring device 12 may include at least one of a brightness meter, a reflectivity tester and a colorimeter, but not limited thereto. It should be understood that the above optical measuring devices are merely exemplary rather than limitative to the embodiment of the invention.

For example, the brightness meter may be used to measure the brightness of the reference object 13 through the transparent display device 11 to be tested, so as to obtain the contrast of the reference object 13. The reflectivity tester may be used to measure the transmittance of the reference object 13 through the transparent display device 11 to be tested. The colorimeter may be used to measure the color gamut of the reference object 13 through the transparent display device 11 to be tested.

Figure 3:
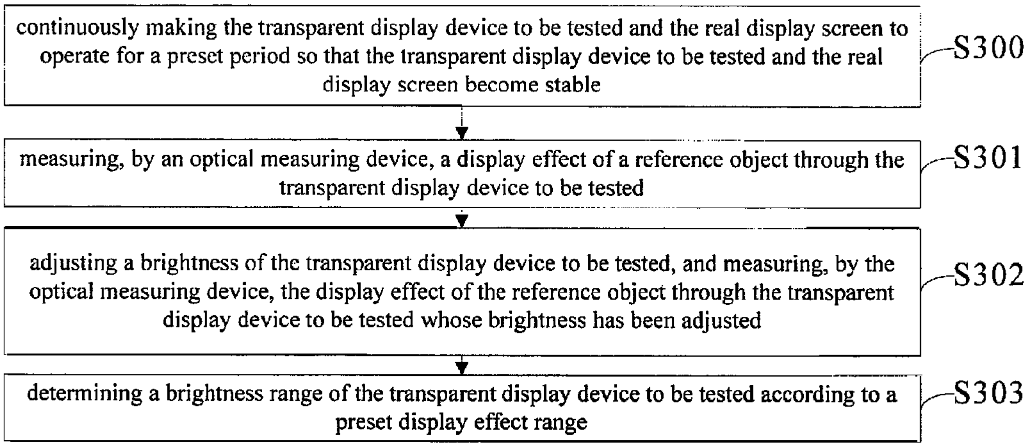
FIG. 3 is a schematic diagram illustrating a test method for a transparent display device according to an embodiment of the invention.

The embodiment of the invention further provides a test method for a transparent display device, which is applicable to any test apparatus for the transparent display device as described above. As shown in FIG. 3, the method comprises the following steps.

S301: Measuring, by an optical measuring device, a display effect of a reference object through a transparent display device to be tested.

The reference object for testing the transparent display device may be, for example, a real object or a real scene. Further, for example, cards with different colors or grayscales may be used as the reference object. Besides, a display screen may be used as the reference object, for example, a Liquid Crystal Display (LCD) or an Organic Light-Emitting Diode (OLED) display may be adopted as the reference object.

The display effect of the reference object may be, for example, a plurality of parameters for describing the display effect such as contrast, transmittance, color gamut and the like of the reference object which are measured by the optical measuring device through the transparent display device to be tested. By measuring such parameters, the display performance of the transparent display device can be effectively tested.

S302: Adjusting a brightness of the transparent display device to be tested; measuring, by the optical measuring device, the display effect of the reference object through the transparent display device to be tested whose brightness has been adjusted.

S303: Determining a brightness range of the transparent display device to be tested according to a preset display effect range.

In practical testing process, the preset display effect range may be ranges of different parameters which are set by the user. For example, the preset display effect range may include a contrast range, a transmittance range and a color gamut range, etc., and these ranges can be determined according to the user's practical requirements.

In the test method for the transparent display device according to the embodiment of the invention, the optical measuring device and the reference object are respectively provided on two sides of the transparent display device to be tested. The optical measuring device measures the display effect of the reference object through the transparent display device to be tested. By adjusting the brightness of the transparent display device to be tested, the brightness of the transparent display device to be tested, which brings about a good display effect can be effectively determined, and accordingly an optimum brightness range of the transparent display device to be tested can be obtained. In this way, a scientific and objective evaluation on the transparent display effect of the transparent display device can be achieved.

Based on this evaluation result, it is able to adjust or improve the design of the transparent display device, so that a more satisfactory practical viewing effect can be obtained.

Further, as shown in FIG. 3, when the reference object is the display screen, before the step S301, the method further includes:

S300: Continuously making the transparent display device to be tested and the display screen to operate for a preset period so that the transparent display device to be tested and the display screen become stable.

Only after the transparent display device to be tested and the display screen operate for the preset period, their respective operation states may tend to be stable. Therefore, the test after the step S300 can obtain more representative product performance of the transparent display device to be tested.

Further, the step of measuring, by an optical measuring device, a display effect of a reference object through a transparent display device to be tested, may include:

Respectively setting the reference object to exhibit a full black image and a full white image; measuring, by the optical measuring device, a brightness of the reference object through the transparent display device to be tested to obtain a contrast of the reference object; and/or, Measuring, by the optical measuring device, a transmittance of the reference object through the transparent display device to be tested; and/or, Respectively setting the reference object to exhibit images of different colors, such as red image, green image and blue image; measuring, by the optical measuring device, a color gamut of the reference object through the transparent display device to be tested.

Further, the step of adjusting a brightness of the transparent display device to be tested may be performed as follows.

The brightness of the transparent display device to be tested is respectively set to n aliquot points between the minimum brightness L0 and the maximum brightness L255 so that an even measurement is performed, where n is a positive integer. As the value of n increases, there are more brightness points available for performing the test between the minimum brightness L0 and the maximum brightness L255, so that the optimum display range value obtained through the test is more accurate. However, as the value of n increases, the number of performing the test will also increase. In practical testing process, the value of n can be selected according to practical requirements. For example, the value of n may take 5 or 7, so that a relatively accurate optimum display range can be obtained after a limited times of tests.

Alternatively, some preset brightness points are selected from the minimum brightness L0 to the maximum brightness L255 so that an uneven measurement is performed. During the practical use of the transparent display device, the brightness commonly used by the user is in the vicinity of the intermediate value between the minimum brightness L0 and the maximum brightness L255. In this case, when the transparent display device is tested, more brightness points may be selected from the vicinity of the intermediate value between the minimum brightness L0 and the maximum brightness L255 (for example, more brightness value points are selected within the brightness range between L80 and L150), and less brightness points may be selected from the vicinity of the minimum brightness L0 and the vicinity of the maximum brightness L255. For example, the brightness points are in a normal distribution. In the case that the number of the brightness points to be measured is the same, the above uneven measurement can improve the test accuracy compared with the above even measurement since the above uneven measurement is performed at more brightness points within the brightness range commonly used by the user. The use of such uneven measurement can effectively control the times of tests on condition that the test accuracy is guaranteed, so that the test efficiency can be improved.

Hereinafter, the test method for the transparent display device according to the embodiment of the invention will be described in detail by taking the test apparatus for the transparent display device shown in FIG. 2 as an example.

The test method for the transparent display device according to the embodiment of the invention may include a test step of a contrast of the reference object, a test step of a transmittance of the reference object, a test step of a color gamut of the reference object and the like. By using the test apparatus shown in FIG. 4, the test step of the contrast of the reference object may be performed as follows.

Both the display screen 13 and the transparent display device 11 operate for a preset period so that the display screen 13 and the transparent display device 11 become stable.

The display screen 13 is set to exhibit a full black image 131 and a full white image 132 respectively, the optical measuring device 12 measures the brightness of the display screen 13 through the transparent display device 11 respectively, so that the contrast of the display screen 13 through the transparent display device 11 is obtained.

The brightness of the transparent display device 11 is set to L0, L63, L127, L191 and L255 respectively. Under the conditions that the transparent display device 11 has different brightnesses, the optical measuring device 12 measures, through the transparent display device 11, the contrast of the display screen 13 behind the transparent display device 11, and the measured contrast is recorded.

Analysis is performed to determine the brightness range of the transparent display device 11 in which the display screen 13 has high contrast through the transparent display device 11.

By using the test apparatus shown in FIG. 2, the test step of the transmittance of the reference object may be performed as follows.

Both the display screen 13 and the transparent display device 11 operate for a preset period so that the display screen 13 and the transparent display device 11 become stable.

The brightness of the transparent display device 11 is set to L0, L63, L127, L191 and L255 respectively. Under the conditions that the transparent display device 11 has different brightnesses, the optical measuring device 12 measures, through the transparent display device 11, the transmittance of the display screen 13 behind the transparent display device 11, and the measured transmittance is recorded.

Analysis is performed to determine the brightness range of the transparent display device 11 in which the display screen 13 has high transmittance through the transparent display device 11.

Figure 5:
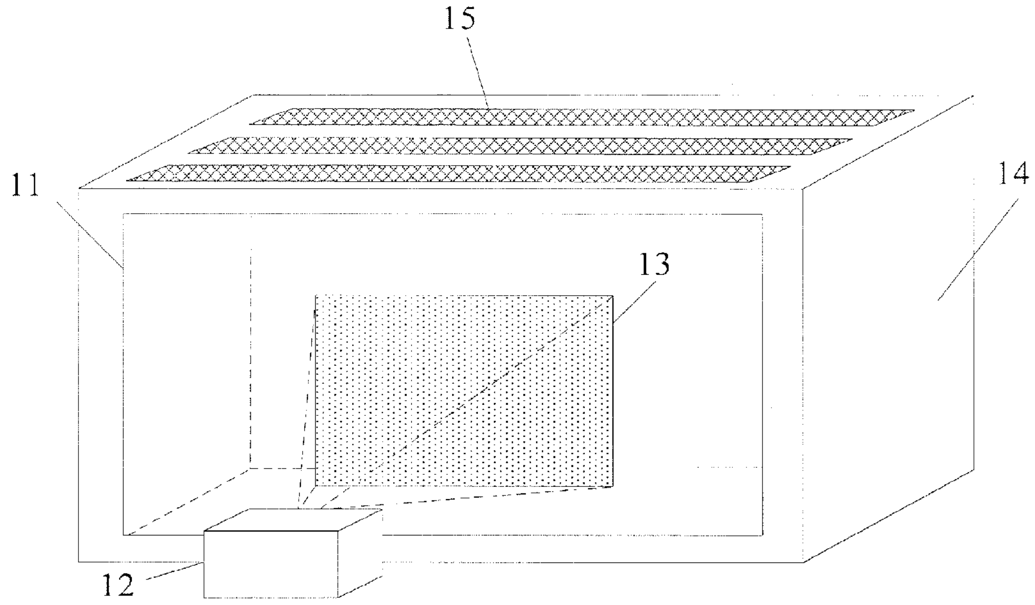
FIG. 5 is a schematic diagram illustrating measuring a color gamut of the reference object by using the test apparatus for the transparent display device according to an embodiment of the invention.

By using the test apparatus shown in FIG. 5, the test step of the color gamut of the reference object may be performed as follows.

Both the display screen 13 and the transparent display device 11 operate for a preset period so that the display screen 13 and the transparent display device 11 become stable.

The display screen 13 is set to exhibit images of different colors (for example, red image, green image, blue image) respectively, and the optical measuring device 12 measures the color gamut value of the display screen 13 through the transparent display device 11 respectively. In FIG. 6, as an example, the display screen 13 is set to exhibit a red image.

The brightness of the transparent display device 11 is set to L0, L63, L127, L191 and L255 respectively. Under the conditions that the transparent display device 11 has different brightnesses, the optical measuring device 12 measures, through the transparent display device 11, the color gamut of the display screen 13 behind the transparent display device 11, and the measured color gamut is recorded.

Analysis is performed to determine the brightness range of the transparent display device 11 in which the display screen 13 has good color gamut through the transparent display device 11.

A comprehensive analysis of the above test results is performed to achieve the optimum brightness range of the transparent display device 11. In the optimum brightness range of the transparent display device 11, the reference object can exhibit good contrast, transmittance and color gamut, that is, the transparent display device 11 can have a better transparent display effect.

It can be seen that in the above embodiment, the description is made by selecting 4 aliquot points between the minimum brightness L0 and the maximum brightness L255 as the brightness points of the transparent display device to be tested. Of course, more brightness points of the transparent display device may be selected. For example, 8 aliquot points between the minimum brightness L0 and the maximum brightness L255 may be selected as the brightness points of the transparent display device to be tested. In this case, the test method may be performed as follows.

Figure 4:
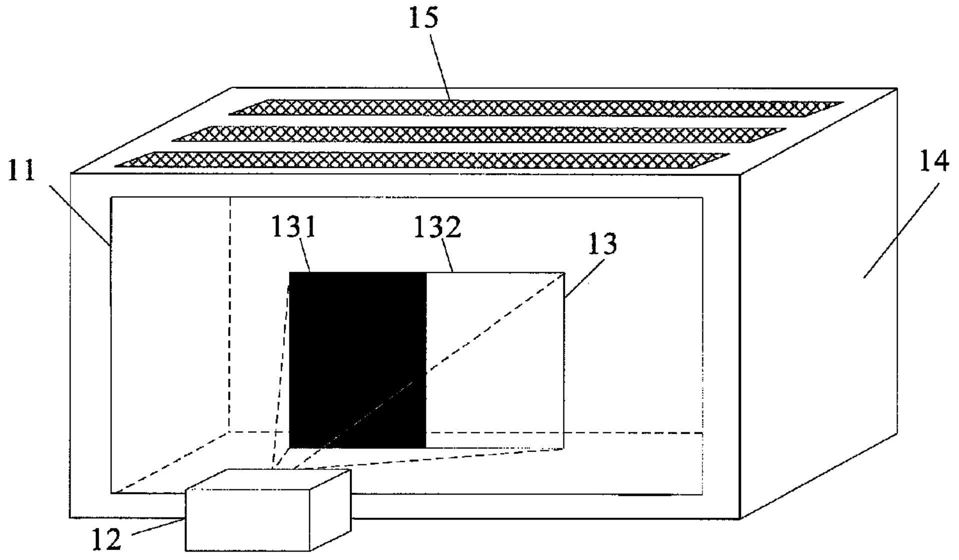
FIG. 4 is a schematic diagram illustrating measuring a contrast of a reference object by using the test apparatus for the transparent display device according to an embodiment of the invention.

By using the test apparatus shown in FIG. 4, the test step of the contrast of the reference object may be performed as follows.

Both the display screen 13 and the transparent display device 11 operate for a preset period so that the display screen 13 and the transparent display device 11 become stable.

The display screen 13 is set to exhibit a full black image 131 and a full white image 132 respectively, the optical measuring device 12 measures the brightness of the display screen 13 through the transparent display device 11 respectively, so that the contrast of the display screen 13 through the transparent display device 11 is obtained.

The brightness of the transparent display device 11 is set to L0, L31, L63, L95, L127, L159, L191, L223 and L255 respectively. Under the conditions that the transparent display device 11 has different brightnesses, the optical measuring device 12 measures, through the transparent display device 11, the contrast of the display screen 13 behind the transparent display device 11, and the measured contrast is recorded.

Analysis is performed to determine the brightness range of the transparent display device 11 in which the display screen 13 has high contrast through the transparent display device 11.

By using the test apparatus shown in FIG. 2, the test step of the transmittance of the reference object may be performed as follows.

Both the display screen 13 and the transparent display device 11 operate for a preset period so that the display screen 13 and the transparent display device 11 become stable.

The brightness of the transparent display device 11 is set to L0, L31, L63, L95, L127, L159, L191, L223 and L255 respectively. Under the conditions that the transparent display device 11 has different brightnesses, the optical measuring device 12 measures, through the transparent display device 11, the transmittance of the display screen 13 behind the transparent display device 11, and the measured transmittance is recorded.

Analysis is performed to determine the brightness range of the transparent display device 11 in which the display screen 13 has high transmittance through the transparent display device 11.

By using the test apparatus shown in FIG. 5, the test step of the color gamut of the reference object may be performed as follows.

Both the display screen 13 and the transparent display device 11 operate for a preset period so that the display screen 13 and the transparent display device 11 become stable.

The display screen 13 is set to exhibit images of different colors (for example, red image, green image, blue image) respectively, and the optical measuring device 12 measures the color gamut value of the display screen 13 through the transparent display device 11 respectively. In FIG. 6, as an example, the display screen 13 is set to exhibit a red image.

The brightness of the transparent display device 11 is set to L0, L31, L63, L95, L127, L159, L191, L223 and L255 respectively. Under the conditions that the transparent display device 11 has different brightnesses, the optical measuring device 12 measures, through the transparent display device 11, the color gamut of the display screen 13 behind the transparent display device 11, and the measured color gamut is recorded.

Analysis is performed to determine the brightness range of the transparent display device 11 in which the display screen 13 has good color gamut through the transparent display device 11.

A comprehensive analysis of the above test results is performed to achieve the optimum brightness range of the transparent display device 11. In the optimum brightness range of the transparent display device 11, the reference object can exhibit good contrast, transmittance and color gamut, that is, the transparent display device 11 can have a better transparent display effect.

It can be clearly seen that as compared with the test method in which 4 aliquot points are selected, the test method in which 8 aliquot points between the minimum brightness L0 and the maximum brightness L255 are selected is performed similarly, but requires more times of tests. In this way, the brightness ranges for selected by the user can be diversified, and the optimum display range can be obtained more accurately. Of course, the brightness points of the transparent display device to be tested may also be unevenly selected according to the user's practical requirements, and the invention shall not make a limitation thereto.

In the test method for the transparent display device according to the embodiment of the invention, the optical measuring device and the reference object are respectively provided on two sides of the transparent display device to be tested. The optical measuring device measures the display effect of the reference object through the transparent display device to be tested. By adjusting the brightness of the transparent display device to be tested, the brightness of the transparent display device to be tested, which brings about a good display effect can be effectively determined, and accordingly an optimum brightness range of the transparent display device to be tested can be obtained. In this way, a scientific and objective evaluation on the transparent display effect of the transparent display device can be achieved. Based on this evaluation result, it is able to adjust or improve the design of the transparent display device, so that a more satisfactory practical viewing effect can be obtained.

It should be understood that all or part of the steps to implement the above test method may be performed by a program instructing related hardware. The program may be stored in computer readable storage media. Upon the program is executed, the steps of the above test method is performed. The storage media include all kinds mediums capable of storing program codes, such as ROM, RAM, magnetic disk, optical disk and the like.

The foregoing are only preferable embodiments of the invention. It is to be noted that, those with ordinary skills in the art may make various modifications and changes without departing the technical principle of the invention, and these modifications and changes should be deemed to be within the protection scope of the invention.

What is claimed is:

1. A test apparatus for a transparent display device, comprising:

an optical measuring device disposed on one side of the transparent display device to be tested, and a reference object disposed on the other side of the transparent display device to be tested, to allow the optical measuring device and the reference object being provided outside the transparent display device to be tested;

wherein brightness of the transparent display device to be tested is adjustable, and the optical measuring device measures a display effect of the reference object through the transparent display device to be tested which is set to different brightness values.

2. The test apparatus for the transparent display device according to claim 1, wherein the test apparatus includes a test box;

one surface of the test box is provided with the transparent display device to be tested, the reference object is disposed inside the test box, and the optical measuring device is disposed outside the test box.

3. The test apparatus for the transparent display device according to claim 2, wherein the test box is a cube box, a cuboid box, a round case or an oval case.

4. The test apparatus for the transparent display device according to claim 1, wherein the reference object is a display screen.

5. The test apparatus for the transparent display device according to claim 4, wherein the display screen is a liquid crystal display or an organic light-emitting diode.

6. The test apparatus for the transparent display device according to claim 1, wherein the optical measuring device includes at least one of a brightness meter, a reflectivity tester, and a colorimeter.

7. The test apparatus for the transparent display device according to claim 1, wherein the test apparatus further includes a light source.

8. The test apparatus for the transparent display device according to claim 7, wherein the light source comprises a LED, a CCFL or an ambient light source.

9. The test apparatus for the transparent display device according to claim 7, wherein, when the test apparatus for the transparent display device includes a test box, at least one surface of the test box is provided with the light source, and light emitting from the light source irradiates to the inside of the test box.

10. A test method for a transparent display device, comprising:

measuring, by an optical measuring device, a display effect of a reference object through the transparent display device to be tested;

adjusting brightness of the transparent display device to be tested, and measuring, by the optical measuring device, the display effect of the reference object through the transparent display device to be tested whose brightness has been adjusted;

determining a brightness range of the transparent display device to be tested according to a preset display effect range;

wherein the optical measuring device and the reference object are provided outside the transparent display device to be tested.

11. The method according to claim 10, wherein the reference object is a display screen.

12. The method according to claim 11, wherein the display screen is a LCD or an OLED display.

13. The method according to claim 11, wherein before the step of measuring, by an optical measuring device, a display effect of a reference object through a transparent display device to be tested, the method further includes:

continuously making the transparent display device to be tested and the display screen to operate for a preset period so that the transparent display device to be tested and the display screen become stable.

14. The method according to claim 10, wherein the step of measuring, by an optical measuring device, a display effect of a reference object through a transparent display device to be tested includes:

respectively setting the reference object to exhibit a full black image and a full white image; measuring, by the optical measuring device, a brightness value of the reference object through the transparent display device to be tested to obtain a contrast of the reference object through the transparent display device.

15. The method according to claim 10, wherein the step of measuring, by an optical measuring device, a display effect of a reference object through a transparent display device to be tested includes:

measuring, by the optical measuring device, a transmittance of the reference object through the transparent display device to be tested.

16. The method according to claim 10, wherein the measuring, by the optical measuring device, a display effect of a reference object through a transparent display device to be tested, includes:

measuring, by the optical measuring device, a color gamut of the reference object through the transparent display device to be tested.

17. The method according to claim 10, wherein the step of adjusting brightness of the transparent display device to be tested includes:

respectively selecting n aliquot points between a minimum brightness L0 and a maximum brightness L255 as the brightness of the transparent display device to be tested, where n is a positive integer.

18. The method according to claim 10, wherein the step of adjusting brightness of the transparent display device to be tested includes:

respectively selecting brightness values in the vicinity of an intermediate value between a minimum brightness L0 and a maximum brightness L255 as the brightness of the transparent display device to be tested.

* * * * *